United States Patent
Hirashita et al.

(10) Patent No.: US 6,750,088 B2
(45) Date of Patent: Jun. 15, 2004

(54) SOI MOS FIELD EFFECT TRANSISTOR AND MANUFACTURING METHOD THEREFOR

(75) Inventors: Norio Hirashita, Tokyo (JP); Takashi Ichimori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/342,191

(22) Filed: Jan. 15, 2003

(65) Prior Publication Data

US 2003/0151094 A1 Aug. 14, 2003

Related U.S. Application Data

(62) Division of application No. 10/043,219, filed on Jan. 14, 2002, now Pat. No. 6,531,743.

(30) Foreign Application Priority Data

Sep. 28, 2001 (JP) ........................................ 2001/300464

(51) Int. Cl.[7] ................... H01L 21/336; H01L 21/8234
(52) U.S. Cl. ........................ 438/197; 438/534; 438/570
(58) Field of Search ........................... 438/92, 167, 197, 438/199, 294, 534, 570, 571, 581, 583

(56) References Cited

U.S. PATENT DOCUMENTS

| | | | | |
|---|---|---|---|---|
| 5,250,834 A | * | 10/1993 | Nowak | 257/350 |
| 5,780,361 A | * | 7/1998 | Inoue | 438/683 |
| 5,877,046 A | * | 3/1999 | Yu et al. | 438/151 |
| 6,044,011 A | | 3/2000 | Marr et al. | 365/154 |
| 6,100,554 A | * | 8/2000 | Ishikawa et al. | 257/275 |
| 6,225,667 B1 | * | 5/2001 | Buynoski et al. | 257/347 |
| 6,509,609 B1 | * | 1/2003 | Zhang et al. | 257/330 |

OTHER PUBLICATIONS

Technical Report of IEICE, Characteristic of SOI–MOSFET with Ni–Silicide Schottky–Barrier Source/Drain, SDN2000–248(2001–03), pp. 55–60.

Jpn. J. Appl. Phys., vol. 37 (1998), Reduction of the Floating Body Effect in SOI MOSFETs by Using Schottky Source/Drain Contacts, Part 1, No. 38, Mar. 1998, pp. 1295–1299.

IEDM 94–429, Technology Trends of Silicon–On–Insulator—Its Advantages and Probems to be Solved, IEEE, pp. 17.1.1–17.1.4.

* cited by examiner

Primary Examiner—Ngan V. Ngo
Assistant Examiner—Hoai Pham
(74) Attorney, Agent, or Firm—Rabin & Berdo, PC

(57) ABSTRACT

A device isolation region made up of a silicon oxide film, which is perfectly isolated up to the direction of the thickness of an SOI silicon layer, and an activation region of the SOI silicon layer, whose only ends are locally thinned, are formed on an SOI substrate. A source diffusion layer and a drain diffusion layer of a MOS field effect transistor in the activation region are provided so that according to the silicidization of the SOI silicon layer subsequent to the formation of a high melting-point metal, a Schottky junction is formed only at each end of the activation region and a PN junction is formed at a portion other than each end thereof.

4 Claims, 4 Drawing Sheets

SOI MOS FIELD EFFECT TRANSISTOR AND MANUFACTURING METHOD THEREFOR

This is a Divisional of U.S. application Ser. No.: 10/043,219, filed Jan. 14, 2002, now U.S. Pat. No. 6,531,743, the subject matter of which is hereby incorporated by reference.

BACKGROUND OF THE INVENTION

1. Field of the Invention

The present invention relates to a structure of a MOS (Metal Oxide Semiconductor) field effect transistor formed on an insulating substrate or an SOI (Silicon On Insulator) substrate, and a method of manufacturing the same. The present invention relates particularly to a substrate floating effect of an SOI MOS field effect transistor.

2. Description of the Related Art

The formation of a MOS field effect transistor (MOSFET) on an SOI substrate in place of a conventional bulk semiconductor substrate has been carried out in recent years. Forming a MOSFET on a silicon thin film placed on an insulating substrate allows a reduction in parasitic capacity such as junction capacitance, wiring capacitance or the like, the suppression of substrate bias effects, improvements in the establishment of soft errors and latch-up, and the achievement of steep subthreshold characteristics. These exert large effects on improvements in performance, such as a reduction in power consumption of an integrated circuit element, an increase in its operating speed, etc.

FIG. 1 is a cross-sectional view of an SOI MOSFET according to a prior art. In FIG. 1, a buried oxide film 2 and an SOI silicon layer are formed over an SOI substrate 1, and the MOSFET is formed in the SOI silicon layer. The MOSFET comprises a gate insulator 3, a gate electrode 4 and a source/drain layer 5. When the source/drain layer 5 has reached the buried oxide film 2, a body region 7 of the SOI MOSFET is perfectly separated from an external potential and a body potential applied to the MOSFET is held in a non-fixed floating state in particular.

The body potential held in the floating state varies depending on the injection of carriers, the generation and recombination thereof in a depletion layer, capacitive coupling to voltages applied to a gate and a drain which surround the body region, etc., and comes under the influence of a substrate floating effect. Therefore, this will induce the degradation of a source/drain withstand voltage, the occurrence of kinks in current/voltage characteristics of a transistor, a steep gradient characteristic (called self latch or single latch) with an increase in drain voltage upon the dependence of a drain current on a gate voltage, etc. It has been known that problems such as the dependence of a delay time on an input frequency, malfunctioning of a dynamic circuit and a pass gate circuit, etc. arise even upon a circuit operation.

Methods for avoiding the above problems and controlling a body potential have been proposed in large numbers. For instance, a reference NO.1 (IEEE, International Electron Device Meeting 1994, pp.429–432) has described the effectivity and problems of various solutions. A method of providing a contact in a body region to fix a potential, and short-circuiting the body region to a source terminal to thereby solve a substrate floating effect, and a method of forming a recombination center serving as a carrier killer at a source/drain junction end, and extinguishing positive holes stored in the body region through a source, etc. have been discussed. Any of these methods presents a problem of some kind while it provides the effect of reducing the substrate floating effect.

There has also been proposed a method of ion-implanting germanium (Ge) into a sour/drain junction region to thereby control an energy band in a valence band. Forming a mixed crystal of silicon.germanium (SiGe) makes it possible to reduce a source-to-body diffused potential difference (potential barrier) and efficiently pull out or extract positive holes stored in an NMOS body region to the source side. However, a problem remains in that the introduction of Ge of 10% or more becomes difficult due to the occurrence of a crystal defect and the resolvable diffused potential difference is about 0.1V, so that the efficiency is not so good.

Further, a reference NO.2 (Japan Journal of Applied Physics Vol.37(1988), pp.1295–1299) or a reference NO.3 (Technical Report of IEICE, SDM2000-248, pp.55–60 (2001)) has proposed a MOSFET having a Schottky barrier junction type source structure, and a MOSFET having a Schottky barrier junction type source/drain structure in place of the conventional MOSFET wherein the source/drain and the body region are separated by the PN junction. It has been shown that the MOSFETs are effective for avoidance of the substrate floating effect.

According to such a method, a Schottky junction made up of high melting-point metal silicide is used, and the height of a Schottky barrier is set lower than a barrier (diffused potential difference) of a PN junction by 0.1V or more. Further, majority carriers (positive holes in the case of NMOS) stored in the body region are efficiently drawn into the source, whereby the substrate floating effect can be resolved. However, this type of structure is accompanied by the problem that since the silicidation of a high melting-point metal is carried out after the formation of gate sidewalls, a region high in resistance is formed between the source and a channel, so that power for driving each MOSFET is reduced.

SUMMARY OF THE INVENTION

The present invention provides an SOI MOS field effect transistor wherein a device isolation region made up of a silicon oxide film, which is perfectly isolated up to the direction of the thickness of an SOI silicon layer is formed, an activation region of the SOI silicon layer, whose only ends are locally thinned, is formed, and a source diffusion layer and a drain diffusion layer of the MOS field effect transistor in the activation region are provided so that according to the silicidation of the SOI silicon layer subsequent to the formation of a high melting-point metal, a Schottky junction is formed only at each end of the activation region and a PN junction is formed at a portion other than each end thereof.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
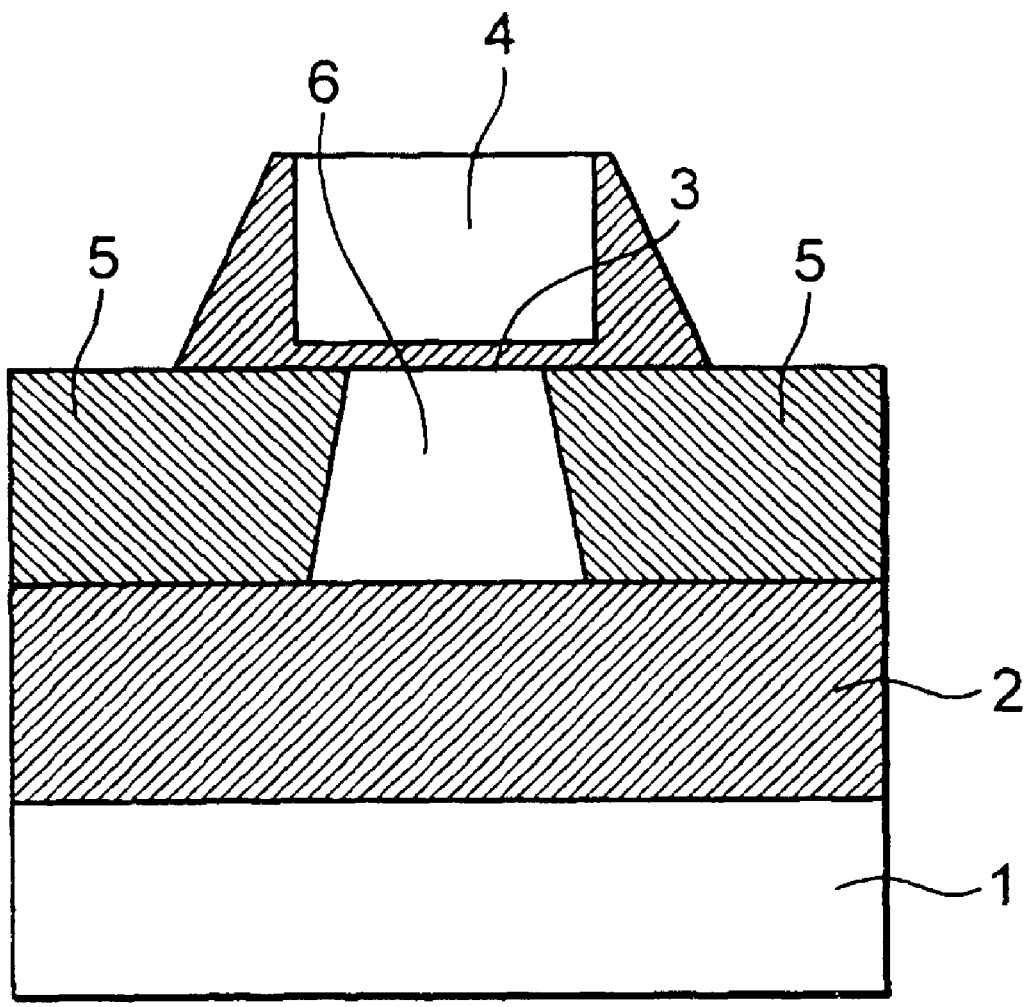
FIG. 1 is a cross-sectional view showing an SOI MOSFET according to the prior art.
Figure 2A:
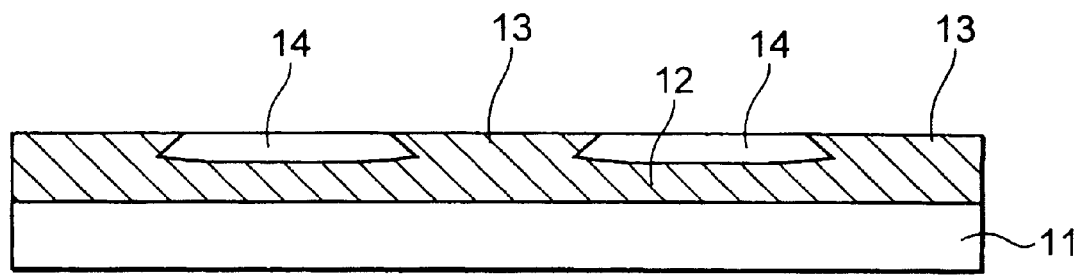
FIGS. 2A through 2C are respectively views illustrating a process for manufacturing an SOI MOSFET for describing an embodiment of the present invention.

A process view for describing an embodiment of the present invention is shown in FIG. 2. As illustrated in FIG. 2A, a buried oxide film 12 and an SOI silicon layer are first formed on an SOI substrate 11. The SOI silicon layer is oxidized by, for example, a LOCOS method to form activation regions 14 formed of the SOI silicon layer, which are surrounded by a device isolating oxide film 13. The oxidization for the formation of a device isolation region is sufficiently carried out so that the thickness of the SOI silicon layer is perfectly substituted with its corresponding oxide film. Further, the transverse oxidization of an end of each activation region is promoted according to the diffusion of oxygen that passes through or penetrates the buried oxide film, whereby the SOI silicon layer at the end of each activation region is formed thin as compared with other portions.

Figure 2B:
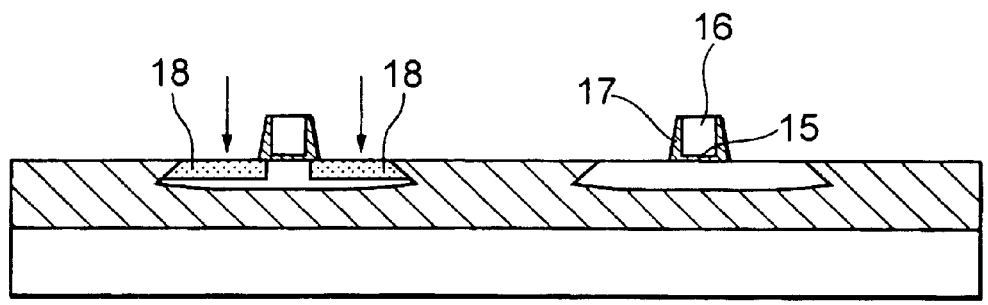
Figure 2C:
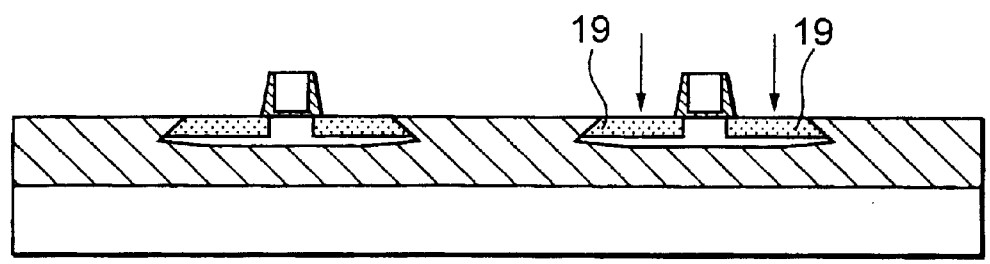

Next, as shown in FIGS. 2B and 2C, a gate oxide film 15 and a polycrystal silicon layer are used to form a gate electrode 16 on each activation region 14. Subsequently, a silicon oxide film ($SiO_2$) and a silicon nitride film ($Si_3N_4$) are deposited by a CVD method and subjected to anisotropic etching to thereby form sidewalls 17, followed by ion-implantation on a self-alignment basis with the gate electrodes 16 as masks, whereby source/drain regions 18 of an N channel MOSFET and source/drain regions 19 of a P channel MOSFET are formed.

Figure 3A:
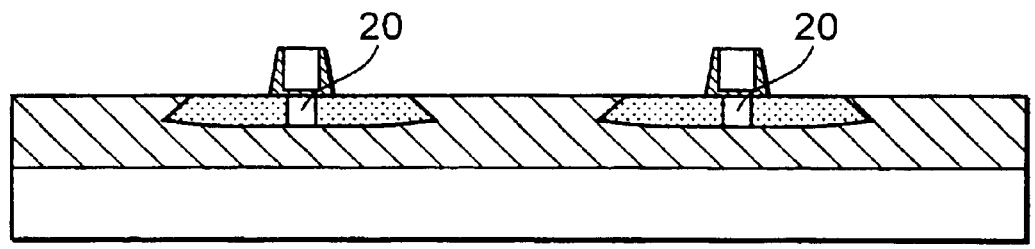
FIGS. 3A through 3C are respectively views showing a process for manufacturing the SOI MOSFET for describing the embodiment of the present invention following FIG. 2C.

Further, as shown in FIG. 3A, heat treatment is carrier out in an atmosphere of a nitrogen ($N_2$) gas at 1000° C. by a RTA (Rapid Thermal Annealing) method or the like to activate the ion-implanted impurity. In the present embodiment, the depths of the diffused layers for the source/drain regions of the N channel MOSFET and the P channel MOSFET are set so as to be identical to the thickness of the SOI silicon layer in each activation region 14. Owing to the activation, PN junctions are respectively formed between the source/drain regions 18 and 19 of the N channel and P channel MOSFETs and body regions 20 of the SOI silicon layer.

Figure 3B:
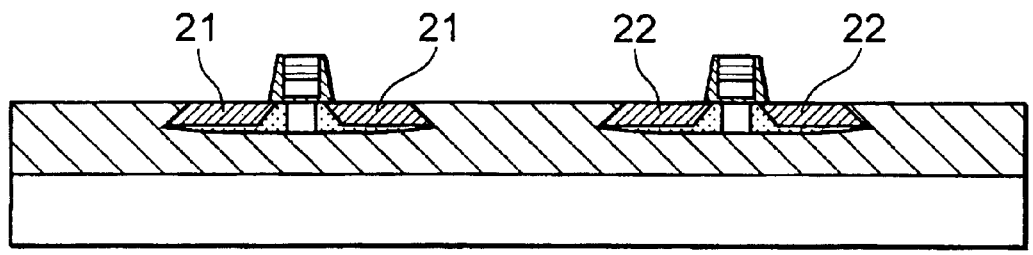

Next, as shown in FIG. 3B, the reduction of resistances of both the diffused layers for the source/drain regions 18 and 19 and the gate electrodes 16 is selectively carried out according to a high melting-point metal salicide process to thereby form high melting-point silicide layers 21 and 22. Since the depths of the diffused layers for the source/drain regions 18 and 19 coincide with the thickness of the SOI silicon layer in the present embodiment, they are equivalent to the amount enough to silicidize the thin SOI silicon layer at the end of each activation region over its whole layer. Further, the thickness of a high melting-point metal is controlled so that the thickness of the SOI silicon layer at other than the ends is not brought into silicidation over its entirety.

For example, a high melting-point metal required to silicidize an SOI silicon layer having a predetermined thickness can be estimated easily from a crystal structure of a silicon layer corresponding to a bulk material. A titanium (Ti) of 17.7 nm is required to bring an SOI silicon layer of 40 nm to titanium silicide ($TikSi_2$) over its entirety. In the case of cobalt silicide ($CoSi_2$) and nickel silicide ($NiSi$), they need to have a cobalt (Co) of 11.3 nm and a nickel (Ni) of 22.4 nm respectively.

Figure 3C:
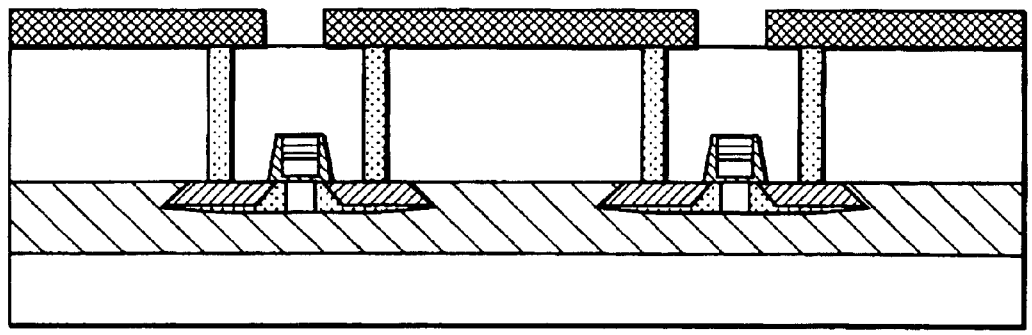
Figure 4:
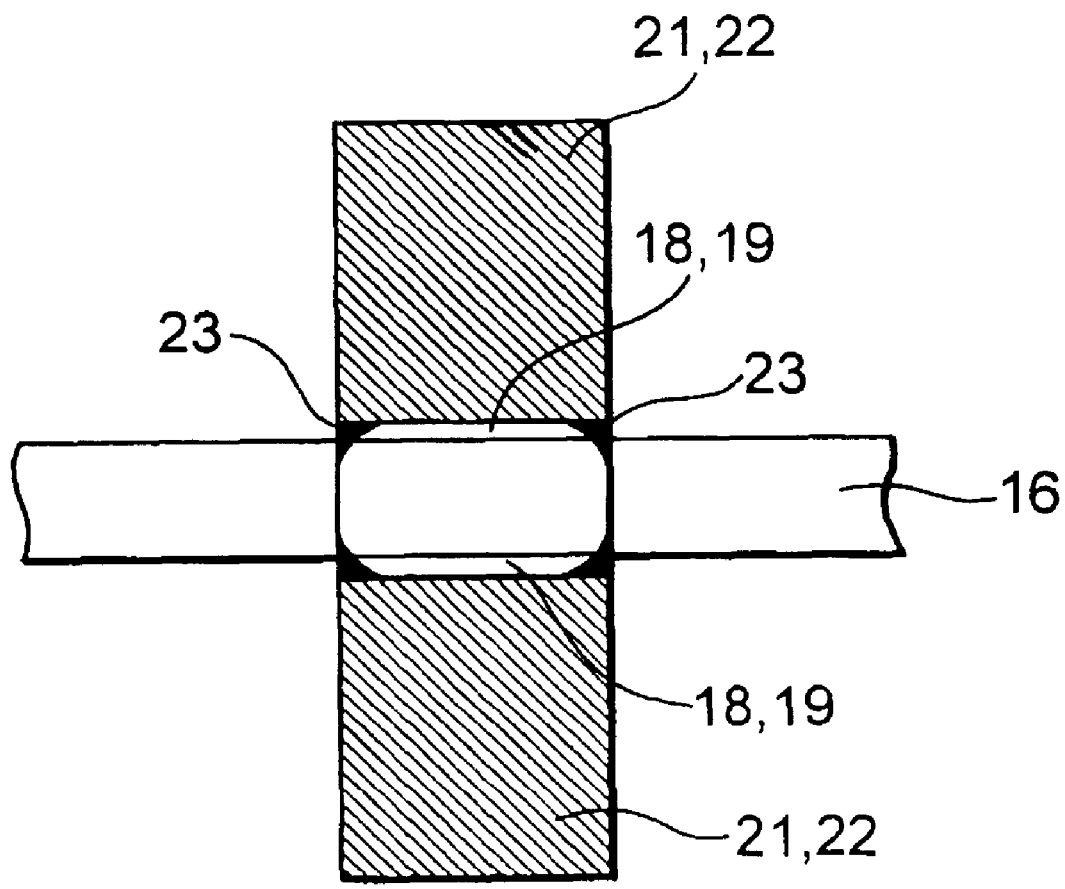
FIG. 4 is a plan view showing the SOI MOSFET according to the present invention.

When the high melting-point metal having the thickness controlled above, which is more than silicidize the thin SOI silicon layer at the end of each activation region over its whole layer, is brought into silicidization, the SOI layer lacks in silicon at the end of the activation region and hence the high melting-point metal reacts with silicon lying in a channel direction to form silicide. Therefore, the silicide will extra grow selectively in the channel direction only at the end of the activation region. As a result, a Schottky barrier-based diode-connected source/drain can be formed only at a portion 23 where the end of the activation region 14 and the gate electrode 16 intersect, as illustrated by a plan view of FIG. 4. After the completion of the salicide process, contact holes are defined and wirings are formed according to the normal CMOS process, thus leading to the completion of each of SOI MOS field effect transistors as shown in FIG. 3C.

In the present embodiment, a Schottky barrier junction small in potential barrier as compared with a PN junction at another portion can easily be formed at part of the source/drain PN junction of the SOI MOS field effect transistor according to the same process as the method of manufacturing the conventional SOI MOS field effect transistor. The substrate floating effect, which has presented the problem at the SOI MOS field effect transistor, can be solved without causing degradation of transistor driving power.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing an SOI MOS field effect transistor, comprising the following steps of:
   oxidizing the thickness of an SOI silicon layer over its entirety to thereby form a silicon, oxide film;
   forming a device isolation region and an activation region in which only ends sharing borders with the device isolation region are locally thinned;
   forming a gate electrode, a source diffusion layer and a drain diffusion layer of the SOI MOB field effect transistor in the activation region; and
   forming a high melting-point metal layer, silicidizing parts of the source diffusion layer and drain diffusion layer except for the sides of the gate electrode and thereby selectively forming a Schottky junction at each end of the activation region and forming a PN junction at a portion other than said each end thereof.

2. The SOI MOS field effect transistor according to claim 1, wherein the silicon oxide film in the device isolation region is formed by perfectly oxidizing the SOI silicon layer and oxidizing even a portion below the SOI silicon layer.

3. The SOI MOS field effect transistor according to claim 1, wherein the thickness of the high melting-point metal layer is larger than a thickness necessary to silicidize the SOI silicon layer at each end of the activation region, and is smaller than a thickness necessary to silicidize the SOI silicon layer at other than the end of the activation region.

4. The SOI MOS field effect transistor according to claim 1, wherein the high melting-point layer is a metal layer selected from cobalt, titanium or nickel.

* * * * *